(12) United States Patent
Gniewoz (10) Patent No.: US 11,714,109 B2
(45) Date of Patent: Aug. 1, 2023

(54) CELL PHONE CASE WITH VOLTAGE DETECTOR

(71) Applicant: Zachary D. Gniewoz, Wilmington, DE (US)

(72) Inventor: Zachary D. Gniewoz, Wilmington, DE (US)

(*) Notice: Subject to any disclaimer, the term of this patent is extended or adjusted under 35 U.S.C. 154(b) by 59 days.

(21) Appl. No.: 17/361,602

(22) Filed: Jun. 29, 2021

(65) Prior Publication Data

US 2021/0405094 A1 Dec. 30, 2021

Related U.S. Application Data (60) Provisional application No. 63/045,449, filed on Jun. 29, 2020.

(51) Int. Cl.
| | | |
|---|---|---|
| G01R 19/00 | (2006.01) | |
| G01R 15/20 | (2006.01) | |
| H01Q 7/00 | (2006.01) | |
| H01Q 1/24 | (2006.01) | |
| H04M 1/02 | (2006.01) | |

(52) U.S. Cl.
CPC ....... G01R 15/207 (2013.01); G01R 19/0084 (2013.01); H01Q 1/242 (2013.01); H01Q 7/00 (2013.01); H04M 1/026 (2013.01); H04M 2201/08 (2013.01)

(58) Field of Classification Search
CPC . G01R 15/207; G01R 19/0084; H04M 1/026; H04M 1/724092
See application file for complete search history.

(56) References Cited

U.S. PATENT DOCUMENTS

| 11,017,689 | B2 | 5/2021 | Pandolfino | |
|---|---|---|---|---|
| 2005/0287959 | A1* | 12/2005 | Park | H01Q 21/28 455/88 |
| 2007/0063856 | A1* | 3/2007 | Gibson | F22B 37/50 340/608 |
| 2007/0159739 | A1* | 7/2007 | Onachilla | H02G 1/005 361/42 |
| 2008/0196910 | A1* | 8/2008 | Radle | B25F 5/00 173/2 |
| 2013/0278552 | A1* | 10/2013 | Kamin-Lyndgaard | G06F 3/04883 345/173 |
| 2014/0159839 | A1* | 6/2014 | Kim | H01H 36/00 335/219 |

(Continued)

FOREIGN PATENT DOCUMENTS

ES 2344889 T3 9/2010

*Primary Examiner* — Dominic E Hawkins
(74) *Attorney, Agent, or Firm* — Christopher Mayle; Bold IP PLLC (57) ABSTRACT

Presented are one or more embodiments of a device which includes a case and a sensor device. The case includes a first indent configured to secure an electronic device, the first indent in a first side of the case, a second indent in a second side of the case opposite the first side, the second indent extending from a first edge of the case in a first direction such that second indent is open at the first edge of the case, and a securing device in the second indent. The sensor device includes an outer casing configured to slide in the first direction in the second indent and at least partially prevented from leaving the second indent by the securing device, and a sensor at least partially in the outer casing.

8 Claims, 11 Drawing Sheets

(56) References Cited

U.S. PATENT DOCUMENTS

| | | | | |
|---|---|---|---|---|
| 2014/0315603 | A1* | 10/2014 | Fathollahi | A45C 15/00 |
| | | | | 455/575.8 |
| 2015/0257285 | A1* | 9/2015 | Wilson | H04B 1/3888 |
| | | | | 224/235 |
| 2015/0320167 | A1* | 11/2015 | Nguyen | A45F 5/00 |
| | | | | 224/191 |
| 2018/0136262 | A1* | 5/2018 | Rahman | G01R 21/08 |
| 2018/0299494 | A1* | 10/2018 | Yen | G01R 19/15 |
| 2019/0182371 | A1* | 6/2019 | Ashall | H04M 1/72469 |
| 2019/0386697 | A1* | 12/2019 | Luo | A45C 11/00 |
| 2020/0169281 | A1* | 5/2020 | Lee | H04M 1/185 |
| 2020/0274571 | A1* | 8/2020 | Cunningham | G06F 3/016 |
| 2020/0395780 | A1* | 12/2020 | Imanaka | H02J 7/00309 |
| 2021/0159585 | A1* | 5/2021 | Choi | G06F 1/1652 |
| 2021/0231915 | A1* | 7/2021 | Barros | A45C 13/002 |

* cited by examiner

CELL PHONE CASE WITH VOLTAGE DETECTOR

CROSS REFERENCE TO RELATED APPLICATIONS

This application claims priority to provisional application No. 63/045,449, filed on Jun. 29, 2020, which is incorporated in its entirety.

FIELD OF THE DISCLOSURE

The present invention relates to devices/cases for covering and protecting cell phones or other electronic devices and devices for detecting voltages or currents.

BACKGROUND

Many workers, including electricians, contractors, and handymen, work with electric wires and need to confirm that the electric wires are not "live" before working with the wires. A voltage detector is an important tool for double checking that electric wires are not live. However, most available voltage detectors are easy to misplace or forget. Also, it is common for others to borrow tools such as voltage detectors so that they are not available to the owner when needed.

Every year many workers are injured because they did not have a voltage detector at hand while working and did not take the time to track down their missing or forgotten voltage detector to double check that a wire was not live before working with the wire.

SUMMARY

One or more embodiments are provided below for a device for a cell phone case with a voltage detector. The device may include a case and a sensor device. The case includes a first indent configured to secure an electronic device, the first indent in a first side of the case, a second indent in a second side of the case opposite the first side, the second indent extending from a first edge of the case in a first direction such that second indent is open at the first edge of the case, and a securing device in the second indent. The sensor device includes an outer casing configured to slide in the first direction in the second indent, is at least partially prevented from leaving the second indent by the securing device, and the sensor is at least partially in the outer casing.

The device may provide significant advantages over the devices known in the art. The device has several advantages over available voltage detectors. It is common for voltage detectors to be misplaced, forgotten, or borrowed, such that they are not available to the owner when needed. It is far less common for a cell phone to be misplaced, forgotten, or borrowed such that the device would not be available to the owner when a voltage detector is needed. Accordingly, the device provides the advantage of being always readily available to the owner. Furthermore, the case may insulate the cell phone or other electronic device held in the case from any electrical current or voltage of the sensor so as to protect the electronic device. Also, the sensor device may be extended from the insulated case which provides distance between the potential voltage or current source and the hand of the user holding the case. Accordingly, the device provides insulating protection for both the user and the electronic device secured by the case.

Other advantageous features as well as other aspects and advantages of the invention will be apparent from the following description and the appended claims.

BRIEF DESCRIPTION OF THE DRAWINGS

Embodiments of the present disclosure are described in detail below with reference to the following drawings. These and other features, aspects, and advantages of the present disclosure will become better understood with regard to the following description, appended claims, and accompanying drawings. The drawings described herein are for illustrative purposes only of selected embodiments and not all possible implementations and are not intended to limit the scope of the present disclosure.

DETAILED DESCRIPTION

In the Summary above and in this Detailed Description, the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

The term "comprises" and grammatical equivalents thereof are used herein to mean that other components, ingredients, steps, among others, are optionally present. For example, an article "comprising" (or "which comprises") components A, B, and C can consist of (i.e., contain only) components A, B, and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number is used herein to denote the end of a range ending with that number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, 25 to 100 mm means a range whose lower limit is 25 mm and upper limit is 100 mm.

Certain terminology and derivations thereof may be used in the following description for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "coupled to" as used herein may mean a direct or indirect connection via one or more components.

Referring now to the drawings and the following written description of the present invention, it will be readily understood by those persons skilled in the art that the present invention is susceptible to broad utility and application. Many embodiments and adaptations of the present invention other than those herein described, as well as many variations, modifications, and equivalent arrangements will be apparent from or reasonably suggested by the present invention and the detailed description thereof without departing from the substance or scope of the present invention. This disclosure is only illustrative and exemplary of the present invention and is made merely for purposes of providing a full and enabling disclosure of the invention.

Figure 1:
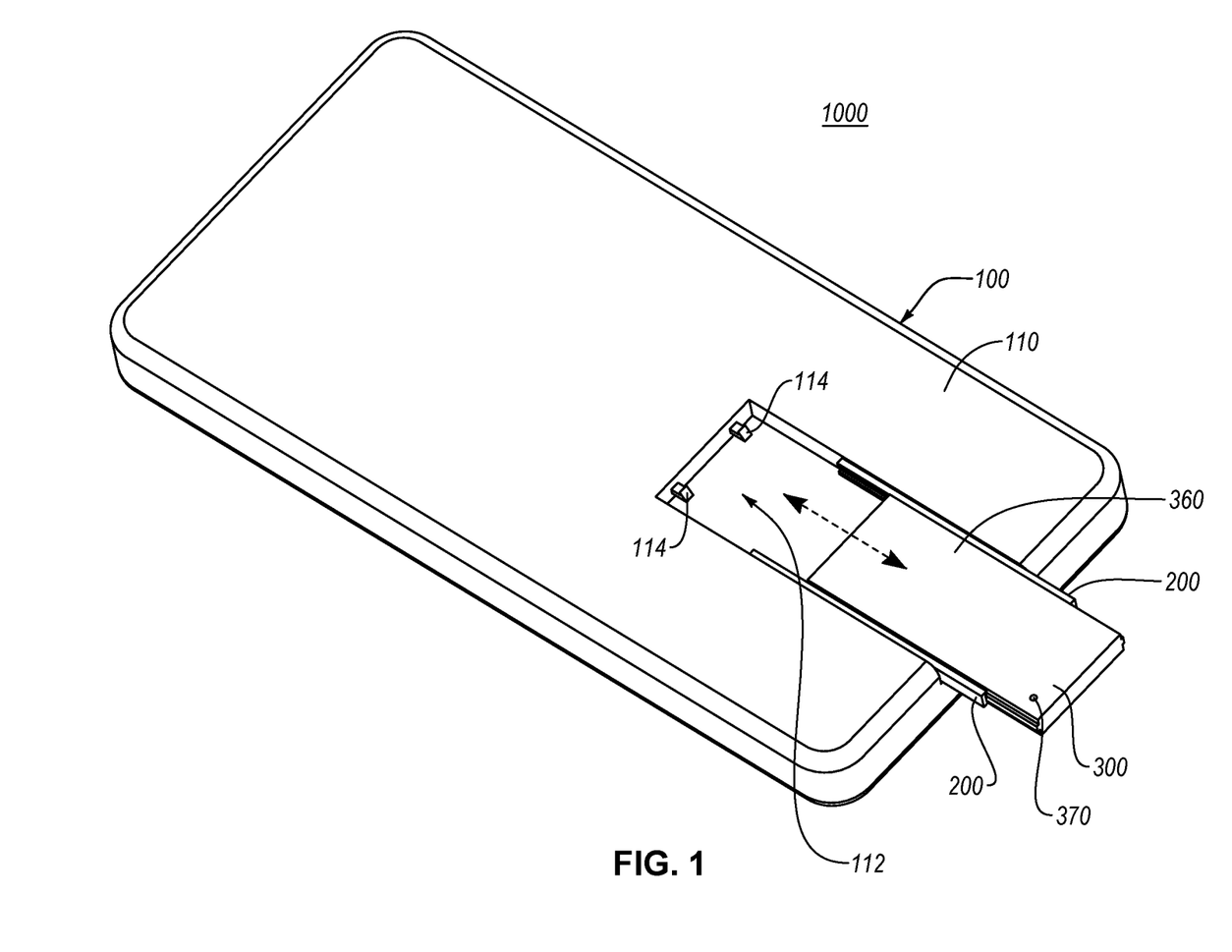
FIG. 1 shows an example top view of a first integrated cell phone case.

FIG. 1 shows a first example top view of an integrated cell phone case 1000. The integrated cell phone case 1000 may include a case body 100 with a main body 110 including slot 112 and holder 114. The integrated cell phone case 1000 may also include an extension system 200 and voltage detector 300. In some embodiments, the extension system 200 may be part of the case body 100. The main body 110 of the case body may be shaped such that the case body 100 fits around a cell phone (not shown in this figure) to protect the cell phone from damage. In one or more non-limiting embodiments, the main body 110 may include a rubberized plastic or other durable material that is insulating and non-conductive of electricity. The slot 112 is a depression, indent, or gap in the main body 110 that is shaped to allow the voltage detector 300 to partially or entirely sit in the slot 112. The holder 114 may secure the voltage detector 300 in place in the slot 112 when the voltage detector 300 is retracted into the slot 112. In some example embodiments, the holder 114 may be at a back of the slot 112 (as shown in FIG. 1).

However, the holder 114 may also be at a front of the slot 112 or in any other position inside or proximate to the slot 112. The holder 114 may be an extension of material of the main body 110 (or another material) into the slot 112 and may operate by pressing the voltage detector 300 upwards and increasing friction between the case body 100 and the voltage detector 300 via the extension system 200. Thus, the holder 114 may at least partially secure the voltage detector 300 in the slot 112 (e.g., by making it harder for the voltage detector 300 to leave the slot 112 when the voltage detector 300 is slid over the holder 114. The holder 114 may be an example of a securing device.

The extension system 200 may connect the voltage detector 300 to the case body 100 within the slot 112. The extension system 200 may allow the voltage detector 300 to extend out of the slot 112 and retract into the slot 112 while securing the voltage detector 300 to the case body 100. The extension system 200 may include a plurality of rails that slide such that the voltage detector 300 may extend out of the slot 112 (in an extension direction) and retract into the slot 112 (in a retraction direction opposite the extension direction). Sides of the slot 112 extend in the extension direction and direction opposite the extension direction such that the slot is defined in the case body 100 extending in the retraction direction and extension direction.

The voltage detector 300 may include an indicator 370 such as a light emitting diode light. As will be described in greater detail below, the voltage detector 300 may have electronic components that detect the presence of a voltage, a current, or a magnetic field. If the voltage detector 300 detects the voltage, current, or magnetic field, the indicator 370 may be used (e.g., lit up or blink) to indicate to a user that the voltage, current, or magnetic field is detected. The voltage detector 300 may be an example of a sensor and other sensors with different electronic components may be used in the place of the voltage detector 300. The voltage detector 300 may include an outer casing 360 which secures and protects the electronic components (sensor) of the voltage detector. The outer casing 360 may have an opening for the indicator 370 to be seen by a user. The outer casing 360 may also have various openings (not shown) for electrical connections for charging batteries, programming, or other similar uses.

Figure 2:
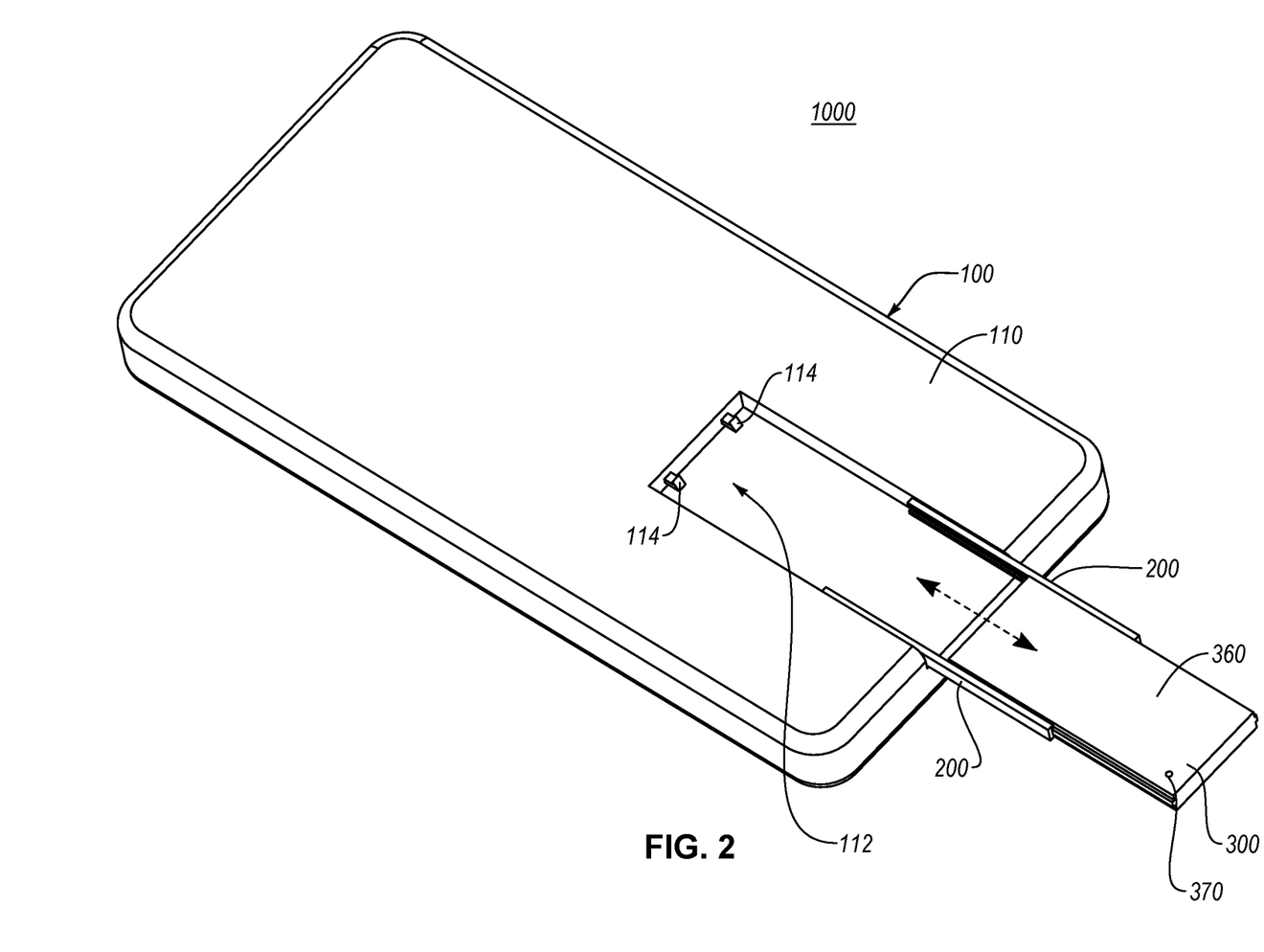
FIG. 2 shows an example top view of the first integrated cell phone case.

FIG. 2 shows an example top view of the first integrated cell phone case 1000. The integrated cell phone case 1000 shown in FIG. 2 shows the extension system 200 extended such that the voltage detector 300 is completely outside of the slot 112. The extension system 200 may also extend the voltage detector 300 so it is only partially extended outside of the slot 112.

Figure 3:
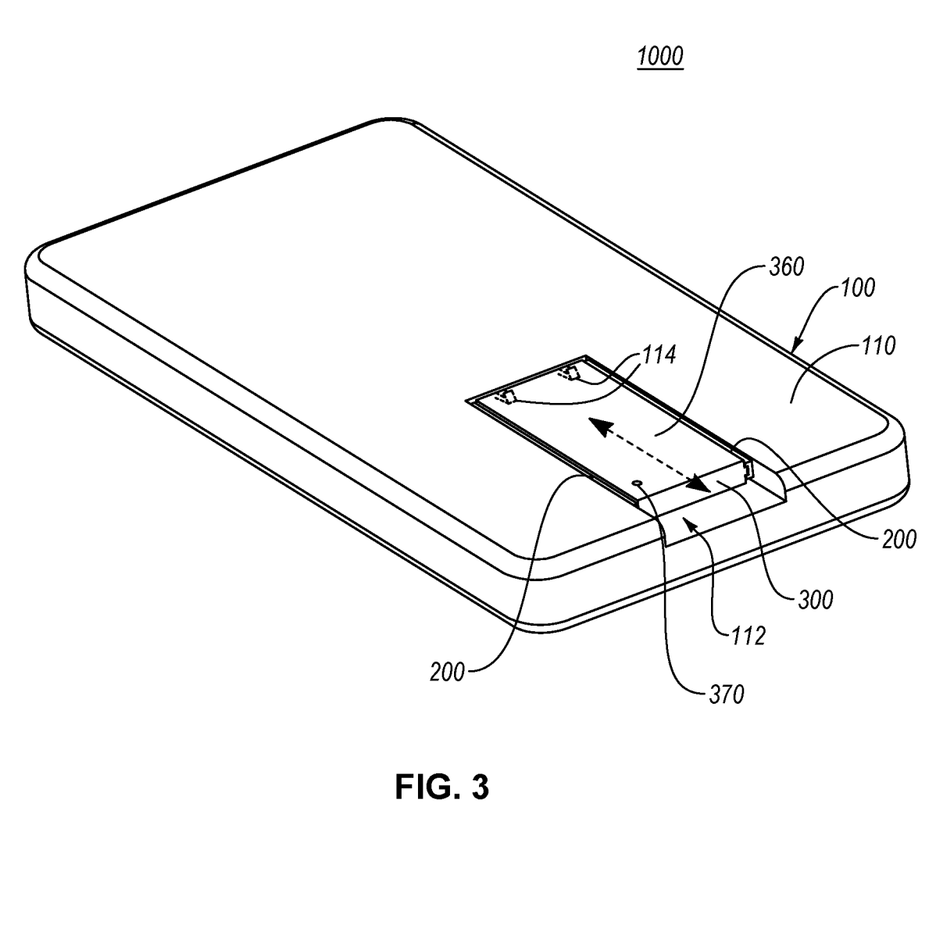
FIG. 3 shows an example top view of the first integrated cell phone case.

FIG. 3 shows an example top view of the first integrated cell phone case 1000. The integrated cell phone case 1000 shown in FIG. 3 shows the extension system 200 retracted such that the voltage detector 300 is in the slot 112 and fixed in position by holder 114.

Figure 4:
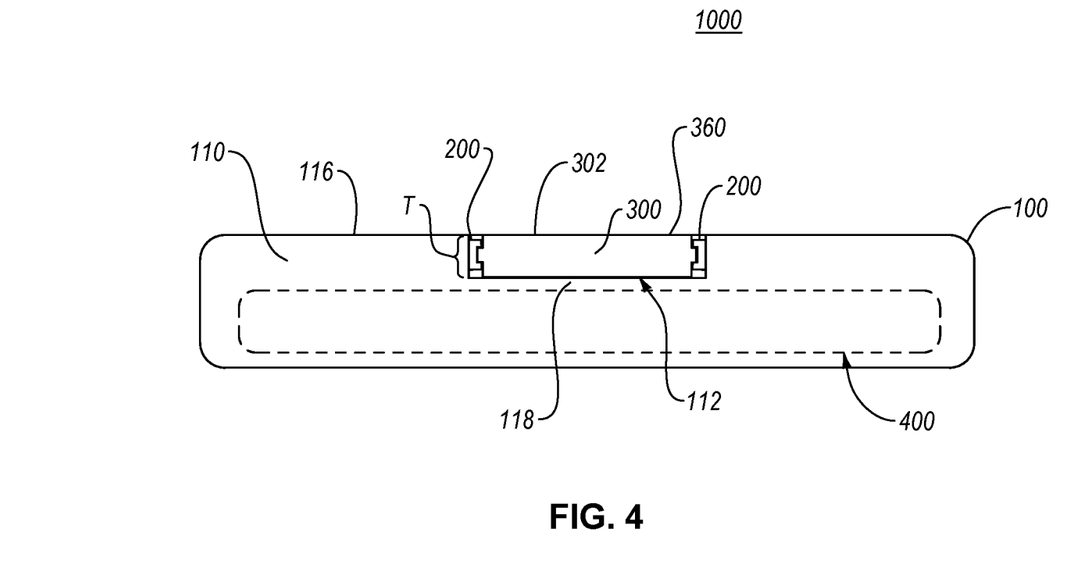
FIG. 4 shows an example side view of the first integrated cell phone case.

FIG. 4 shows an example side view (bottom side relative to the normal orientation of a cell phone being held) of the first integrated cell phone case 1000. The integrated cell phone case 1000 may hold a cell phone 400 (or other electronic device) inside an area (such as an indent) for securing the cell phone 400. The case body 100 may define the area or indent in which the cell phone 400 is secured/held. The area or indent in which the cell phone is secured may be on an opposite side of the case body 100 as the slot 112. The case body 100 may extend above the cell phone 400 (from the perspective of FIG. 4) sufficiently for the voltage detector 300 to sit entirely in the slot 112 in the case body 100 such that a top surface of the voltage detector 302 is level or about level with a top surface of the case body 116. In other example embodiments, the top surface of the case body 116 may be curved. The top surface of the voltage detector 302 may follow the curved top surface of the case body 100 such that when the voltage detector is in the slot 112, there is no bulge or significant gap in the top surface of the integrated cell phone case 1000 (including the top surface of the voltage detector 302 and the top surface of the case body 116). The voltage detector 300 may have a thickness T of about 4-15 millimeters. The case body 100 may include a layer of insulating material 118 between the slot 112, extension system 200, and voltage detector 300 and the cell phone 400 in order to insulate the cell phone 400 from any voltage or current on or in the voltage detector 300 or extension system 200. Accordingly, the slot 112 and the area or indent that the cell phone 400 is secured in may be completely separate.

Since many cell phones have cameras and other devices that require holes in a cell phone case in the upper portion of the cell phone case, the voltage detector 300 may extend from a bottom of the case body 100. However, in various example embodiments, the voltage detector 300 may extend from any side of the case body 100. Further, in some example embodiments the voltage detector 300 may extend from the slot 112 by rotating rather than or in combination with linear extension.

The integrated cell phone case 1000 shown in FIG. 4 shows the extension system 200 retracted such that the voltage detector 300 is in the slot 112. The slot 112 extends all the way to the edge of the bottom side of the case body 100 such that the voltage detector 300 is visible from the bottom side and the slot 112 is open on the bottom side.

Figure 5:
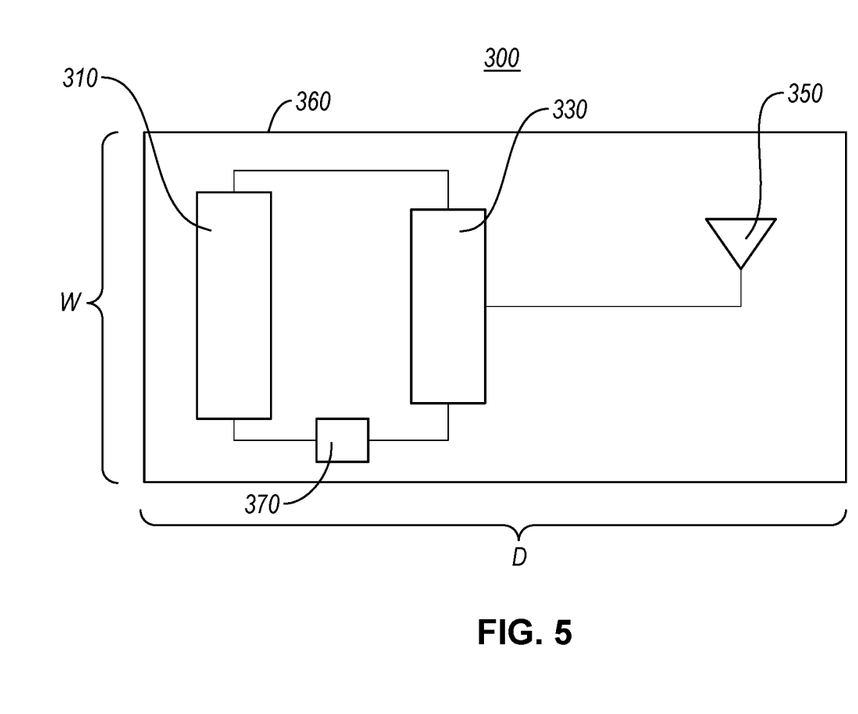
FIG. 5 shows a schematic view of an interior of a voltage detector.

FIG. 5 shows a schematic view of an interior of a voltage detector 300 in accordance with a non-limiting embodiment. The voltage detector may include a power source 310, an amplifier 330, an antenna 350 and an indicator 370 secured within or at least partially within the outer casing 360. For example, in some embodiments a portion of the antenna 350 may be outside the outer casing 360. The power source 310, amplifier 330, antenna 350, and indicator 370 (electronic components) may together be considered a sensor. The power source 310 may be a battery or a connection to an exterior power source such as a battery in the cell phone 400 shown in FIG. 4 or a battery housed in the case body 100 as shown in FIG. 4. The amplifier 330 may be one or a series of amplifiers, including, but not limited to MOSFETS, which amplify a signal from the antenna 350. For example, the antenna 350 may be connected to a gate of a MOSFET to amplify an output signal from the antenna 350. The antenna 350 may take various forms (as discussed in further detail below). The antenna 350 functions to detect a voltage by detecting a change in the magnetic field. The change in the magnetic field induces a current and voltage in the antenna 350. An amplified output signal may be output by the amplifier 330 to power the indicator 370 based on the current and voltage in the antenna 350. The indicator 370 may be a light, sound generator, or other device or a combination of devices for letting a user know that a voltage is detected.

The antenna 350 may be at one end of the voltage detector 300, for example the bottom end (end that aligns with the bottom side of the case body 100 when the voltage detector is completely within the slot 112). In this way when the voltage detector is partially or fully extended from the case body 100 by the extension system 200, the antenna 350 is at least partially (or is fully) extended out of the slot 112 with the voltage detector 300 being secured to the case body 100 by the extension system 200.

The voltage detector 300 may have a width W of about one to three centimeters. The voltage detector 300 may have a depth D of about three to five centimeters. These are just exemplary dimensions and various other dimensions may be used in one or more alternative embodiments.

Figure 6:
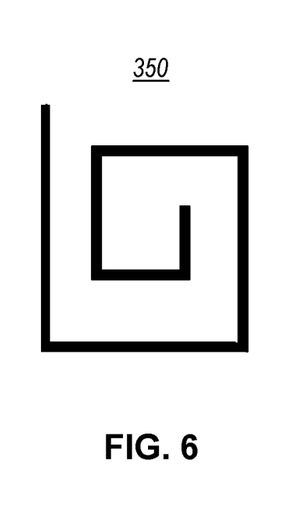
FIG. 6 shows a first example embodiment of an antenna.

FIG. 6 shows a first example embodiment for an antenna, namely, antenna 350. The antenna 350 is coiled in a two-dimensional plane to act as an inductor to detect changes in the magnetic field caused by a current or alternating current voltage. The more loops the coil has the more sensitive the antenna 350 will be. The antenna 350 may be an example of the antenna 350 shown in FIG. 5.

Figure 7:
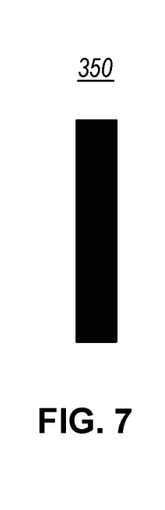
FIG. 7 shows a second example embodiment of an antenna.

FIG. 7 shows a second example embodiment for an antenna, namely, antenna 350. The antenna 350 is a segment of wire that extends in a detection direction and acts to detect a magnetic field, or more specifically, changes in the magnetic field. The antenna 350 may be advantageous because antenna 350 may be simpler to construct and can detect changes in the magnetic field at close distances. The antenna 350 may be an example of the antenna 350 shown in FIG. 5.

Figure 8A:
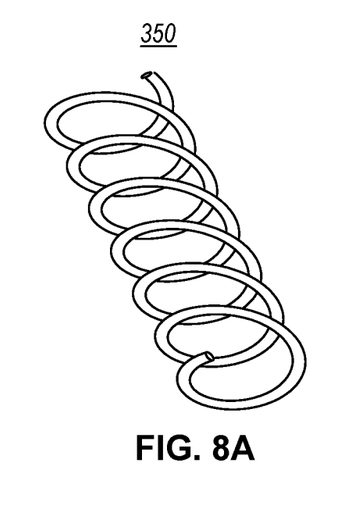
FIG. 8A shows a first view of a third example embodiment for an antenna.
Figure 8B:
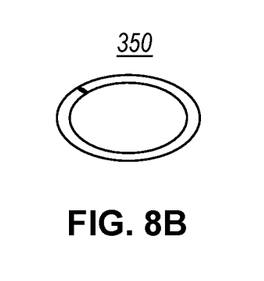
FIG. 8B shows a second view of a third example embodiment for an antenna.

FIG. 8A shows a first view of a third example embodiment of an antenna, such as antenna 350. FIG. 8B shows a second (front) view of antenna 350. The antenna 350 may be a corkscrew type coil (i.e., has a coil shape) which is somewhat flattened to fit inside the voltage detector 300. The shape of the antenna 350 may allow the antenna 350 to detect changes in magnetic field in a different plane than the antenna 350. In some example embodiments, multiple antennas 350 may be included in the voltage detector 300 to detect changes in magnetic field in multiple planes. For example, the antenna 350 may include a first antenna (such as antenna 350) which coils in a first plane, and a second antenna (such as antenna 350) which coils in a second plane in one or more non-limiting embodiments. The antenna 350 may be an example of the antenna 350 shown in FIG. 5.

Figure 9:
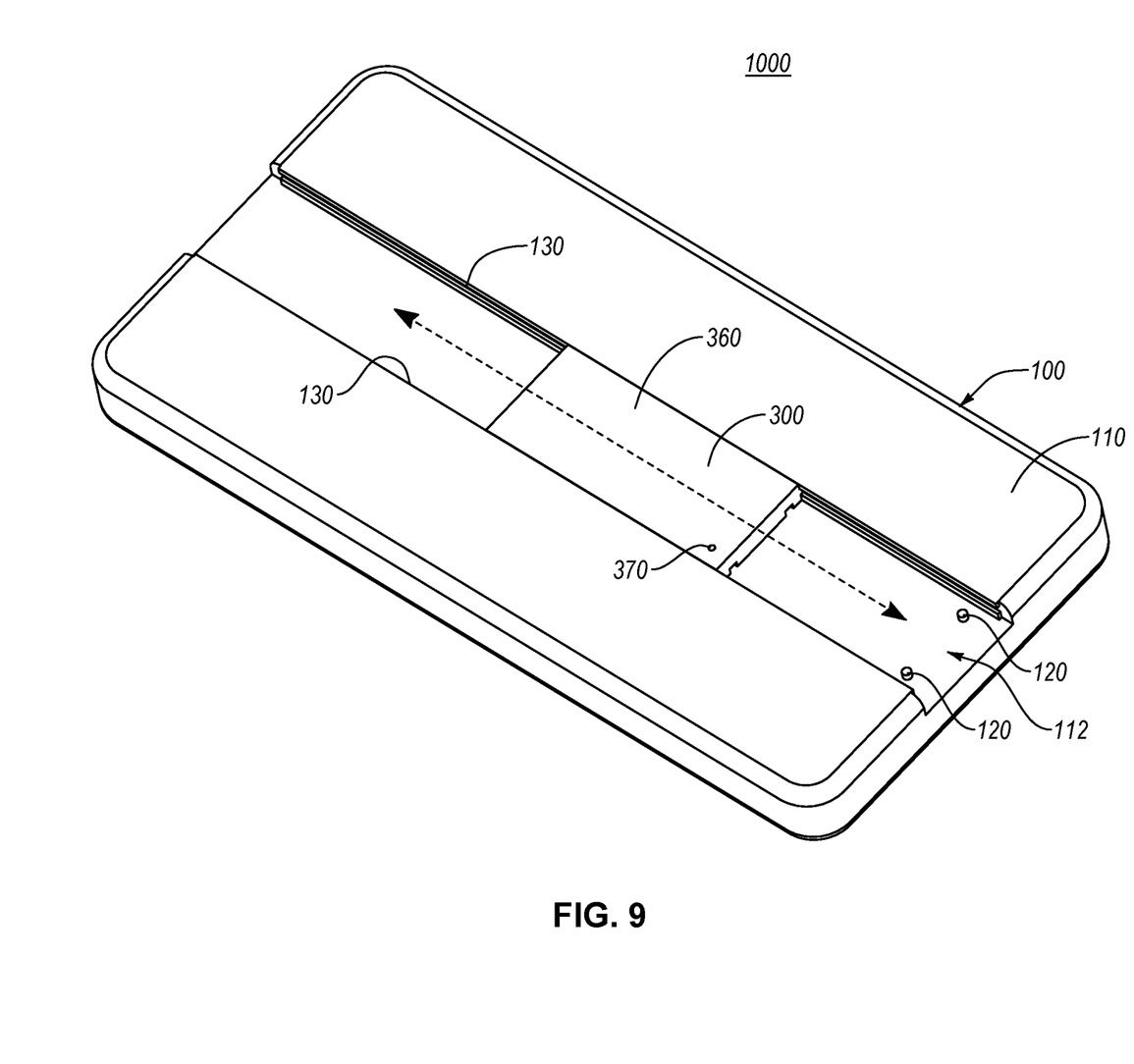
FIG. 9 shows an example top view of a second integrated cell phone case.

FIG. 9 shows an example top view of a second integrated cell phone case 1000. The slot 112 for the second integrated cell phone case 1000 may extend completely across the case body 100 such that the slot 112 is open on two opposite sides of the case body 100. The case body 100 may include a lips 130 extending over a portion of the slot 112. The lips 130 may act as an extension system that secures the voltage detector 300 in the slot and allows the voltage detector 300 to slide in the slot 112 and prevents the voltage detector 300 (along with the sides and bottom of the slot 112 defined in the main body 110) from exiting the slot 112 in a direction other than the directions of the open ends of the slot 112. The lips 130 may extend down the entire length of the sides of the slot 112. There may be stoppers 120 in the slot 112 proximate to one of the sides of the case body 100 (one of the sides of the case body 100 that is one of the two opposite sides where the slot 112 is open). The stoppers 120 may be extensions of the same material as the main body 110 or may be made of a more durable material such as metal or harder plastic because the stoppers 120 may have greater forces applied to them in normal usage than the main body 110. The holders 120 may be an example of securing devices.

Figure 10:
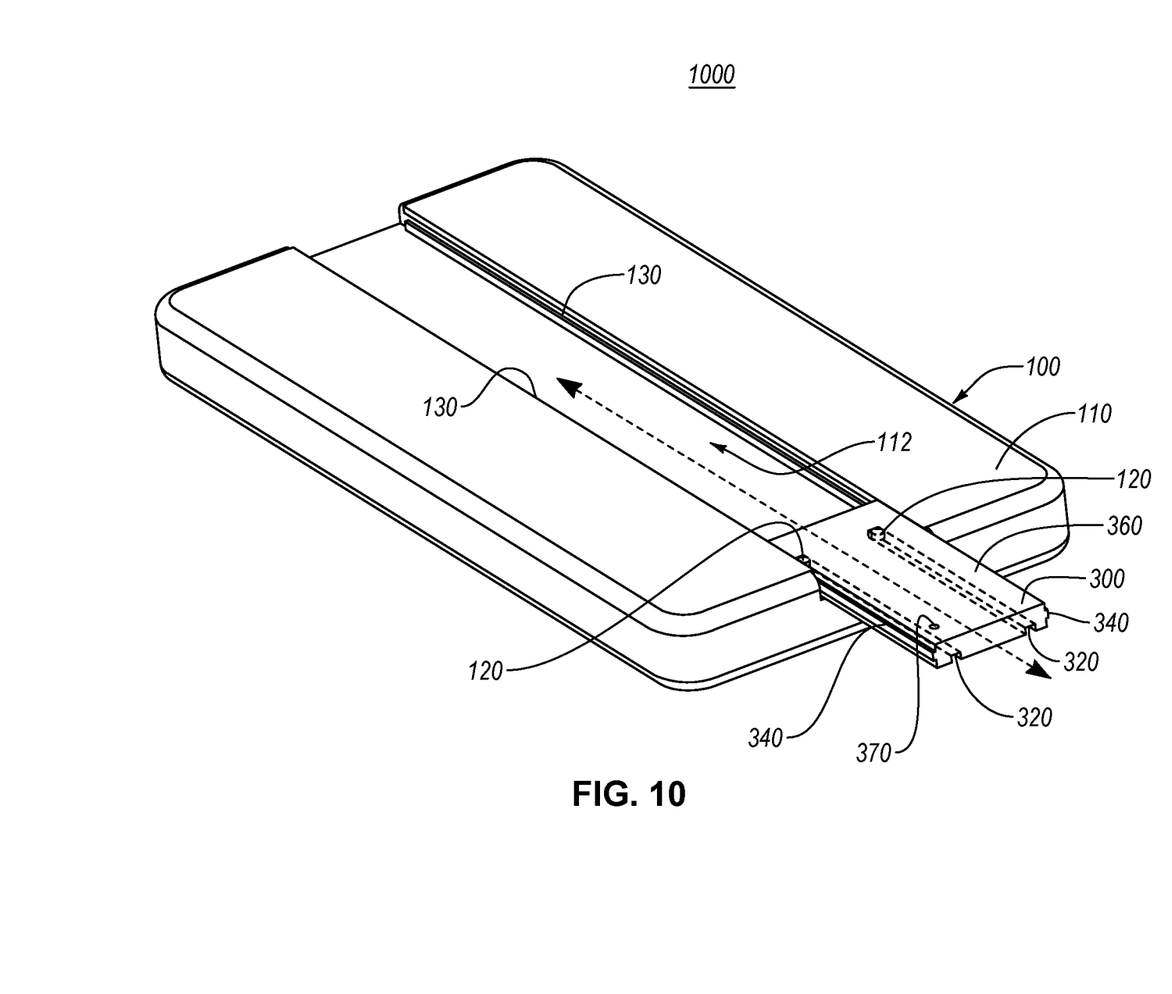
FIG. 10 shows an example top view of the second integrated cell phone case.

FIG. 10 shows an example top view of the second integrated cell phone case. In FIG. 10 the voltage detector 300 is shown partially out of the slot 112 of the case body 110. The voltage detector 300 may include slots 320 defined in the outer casing 360, the slots 320 may not extend down the entire depth of the voltage detector. The slots 320 may be arranged to slide over the stoppers 120 (in an extension direction along the slot 112) until the voltage detector is partially extended out of the slot 112 (preferably with at least a portion of the antenna 350 extended out of the slot 112). Accordingly, the extension system (lips 130) may allow the voltage detector 300 to slide to a position where the antenna 350 is at least partially extended out of the slot 112 with the voltage detector 300 being secured to the case body 100. The stoppers 120 may then contact the respective ends of the slots 320, as shown in FIG. 10, and prevent the voltage detector 300 from completely exiting the slot 112 and thus maintain the voltage detector 300 secured to the case body 110.

The outer casing 360 of the voltage detector 300 may also include shaped side 340 with a shape complementary to the sides of the slot 112 with the lips 130 such that the voltage detector 300 fits in the slot 112 and will not slide out with normal usage of the cell phone 400 but without such high friction that the voltage detector 300 cannot be moved by hand in the slot 112. The force needed to move the voltage detector 300 in the slot 112 may be about 5-20 pounds of force. The shaped sides 340 may extend under the lips 130 to prevent the voltage detector 300 from exiting the slot in a direction other than the open ends of the slot 112.

Figure 11:
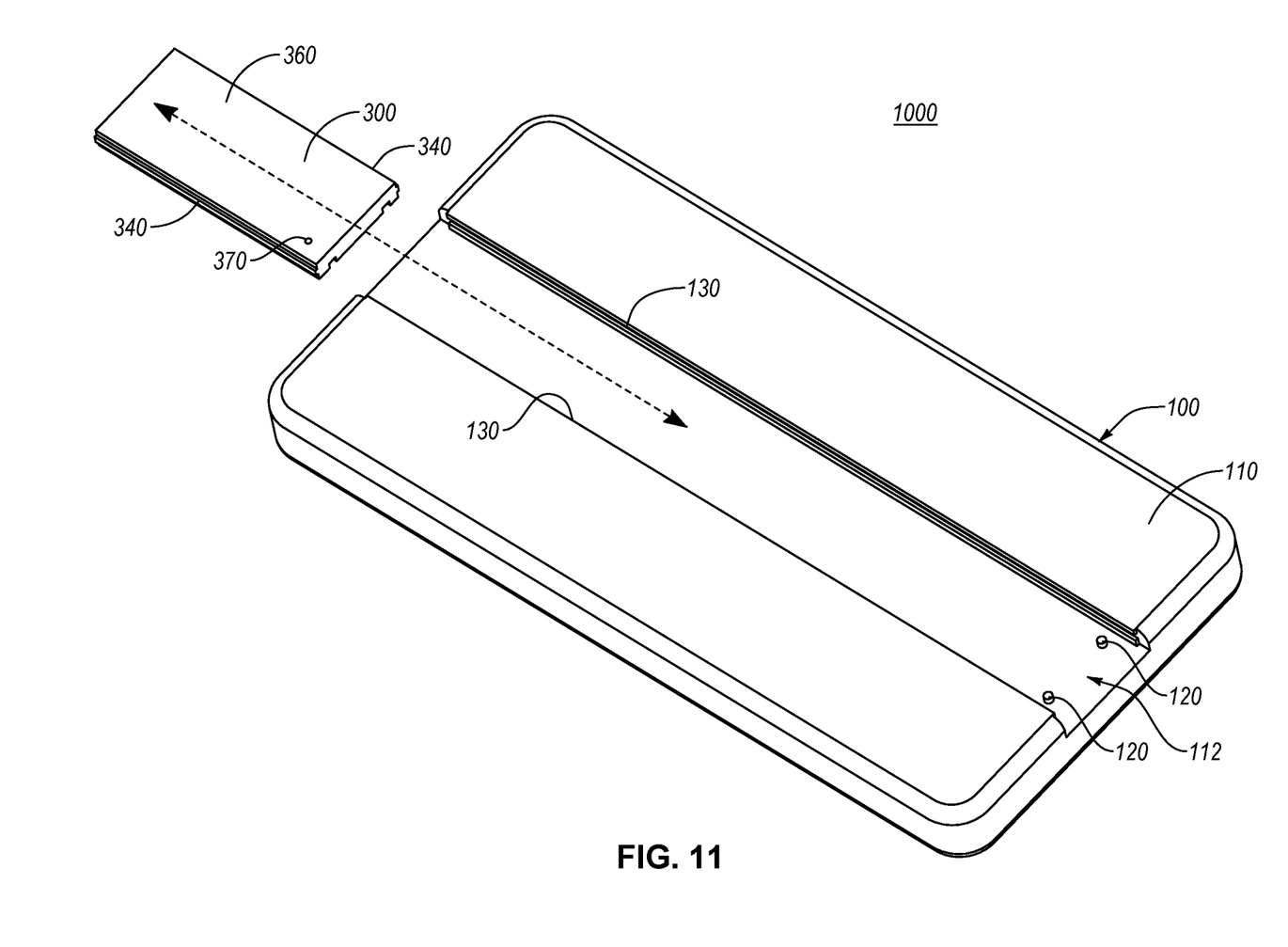
FIG. 11 shows an example top view of the second integrated cell phone case.

FIG. 11 shows an example top view of the second integrated cell phone case. In FIG. 11 the voltage detector 300 is shown completely out of the slot 112. The voltage detector 300 may exit the slot 112 (in an exit direction opposite the extension direction) on the open side of the slot opposite the side of the slot with the stopper 120.

Figure 12:
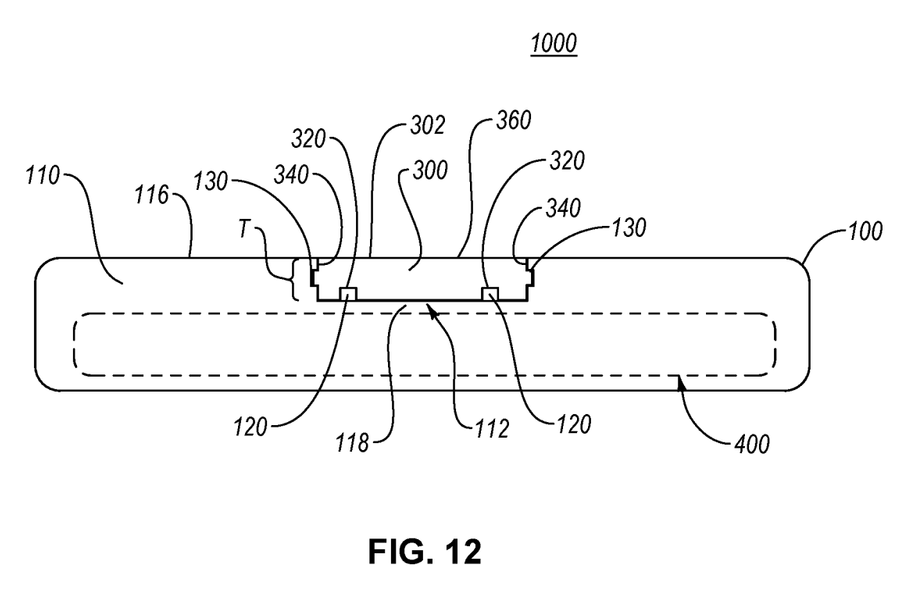
FIG. 12 shows an example side view of the second integrated cell phone case.

FIG. 12 shows an example side view (bottom side relative to the normal orientation of a cell phone being held) of the second integrated cell phone case 1000. The shaped sides 340 may fit under and beside the lips 130 and the sides of the slot 112 such that the shape of the shaped side 340 is completely complementary to the sides of the slot 112 without significant gaps. In this way, the rotational motion and other motions that may cause a rattling sound between the case body 100 and the voltage detector 300 may be reduced or eliminated. The slot 112 extends all the way to the edge of the bottom side of the case body 100 such that the voltage detector 300 is visible from the bottom side and the slot 112 is open on the bottom side. The slot 112 also extends all the way to the edge of the top side (opposite the bottom side) of the case body 100 such that the slot 112 is open on the top side.

Figure 13:
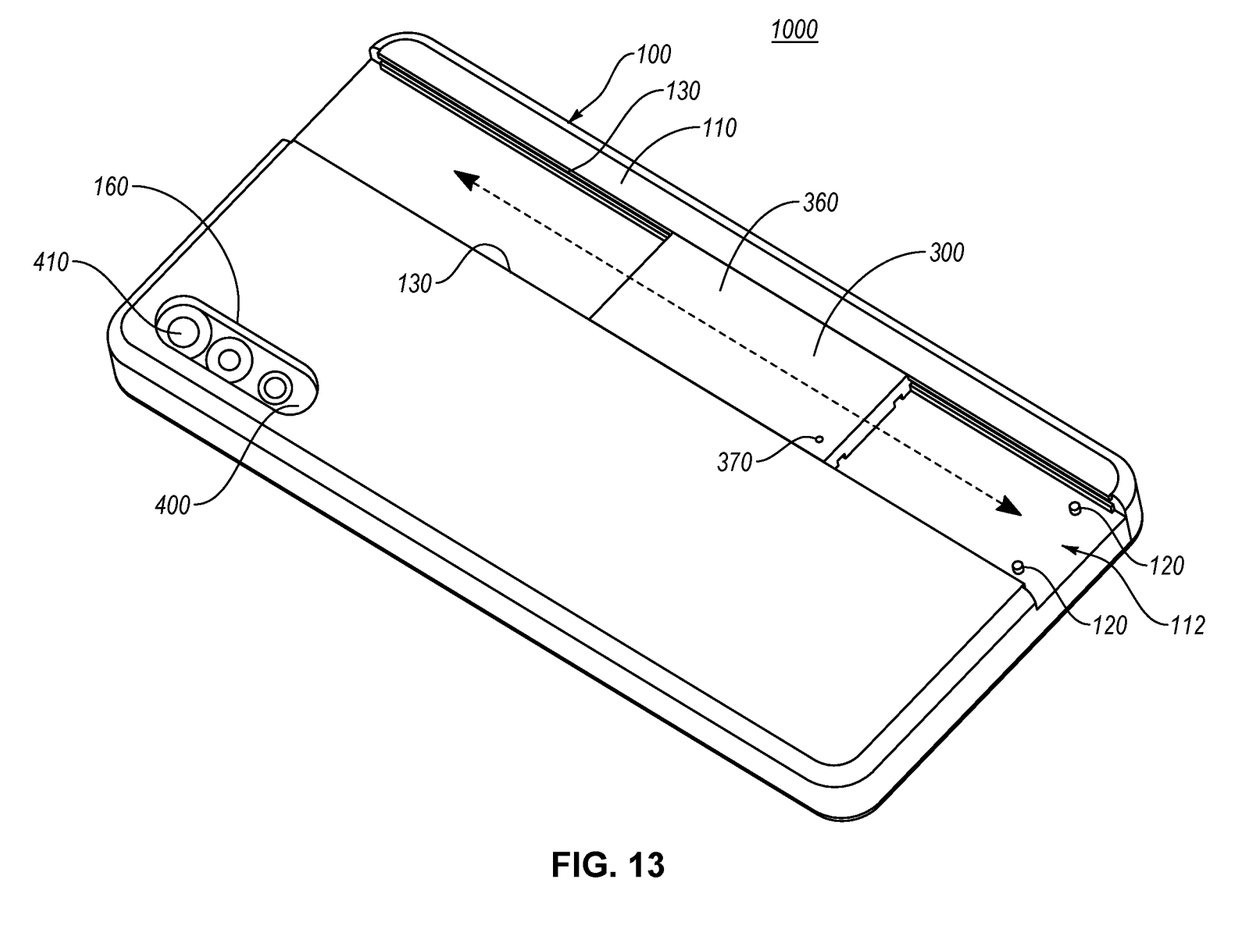
FIG. 13 shows an example top view of a third integrated cell phone case.

FIG. 13 shows an example top view of a third integrated cell phone case 1000. The main body 110 may include an opening 160 for elements 410 of the cell phone 400 to not be obscured by the case body 100. The elements 410 may include cameras, flash, microphones, etc. The slot 112 may be positioned to not overlap with the opening 160. The slot 112 may extend in any direction along the case body 100.

The integrated cell phone case 1000 has several advantages over available voltage detectors. It is common for voltage detectors to be misplaced, forgotten, or borrowed, such that they are not available to the owner when needed. It is far less common for a cell phone to be misplaced, forgotten, or borrowed such that the integrated cell phone case would not be available to the owner when a voltage detector is needed. Accordingly, the integrated cell phone case 1000 provides the advantage of being readily available to the user whenever the user has his/her cell phone.

An advantage of case body 100 is that case body 100 includes an insulating material such that the case body 100 protects a user and the cell phone 400 from any voltage or current on or in the voltage detector 300 or extension system 200.

The extension system allows the voltage detector 300 to extend from the case body 100 to allow for the voltage detector 300 to reach locations that otherwise would not be reachable and also to increase a distance between a potentially live wire and the cell phone 400.

In some embodiments, the voltage detector 300 may be easily removable. For example, the rails of the extension system 200 may be omitted and the voltage detector 300 may slide out of the slot 112.

Accordingly, the present description provides for various embodiments for an integrated cell phone case 1000. Many uses and advantages are offered by the integrated cell phone case 1000 as described above in one or more non-limiting embodiments in the present description.

Many different embodiments of the inventive concepts have been shown. A person of ordinary skill in the art will appreciate that the features from different embodiments may be combined or replaced with other features from different embodiments.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention.

The embodiments were chosen and described in order to best explain the principles of the invention and the practical application, and to enable others of ordinary skill in the art to understand the invention for various embodiments with various modifications as are suited to the particular use contemplated. The present invention according to one or more embodiments described in the present description may be practiced with modification and alteration within the spirit and scope of the appended claims. Thus, the description is to be regarded as illustrative instead of restrictive of the present invention.

What is claimed is:

1. A device comprising:
   a case including:
   a first indent configured to secure an electronic device, the first indent in a first side of the case,
   a second indent in a second side of the case opposite the first side, the second indent extending from a first edge of the case in a first direction such that the second indent is open at the first edge of the case, and
   a securing device in the second indent; and
   a sensor device including:
   an outer casing configured to slide in the first direction in the second indent and be at least partially prevented from exiting the second indent by the securing device;
   a sensor at least partially in the outer casing, wherein the sensor includes an antenna; and
   an extension system that allows the sensor device to slide to a position where the antenna is at least partially extended out of the second indent with the sensor device being secured to the case.

2. The device of claim 1, wherein the sensor device is configured to detect a magnetic field.

3. The device of claim 1, wherein the sensor device further includes an indicator which is configured to indicate if a magnetic field is detected.

4. The device of claim 1, wherein the case includes an insulating material between the first indent and the second indent such that the first indent and the second indent are completely separate.

5. The device of claim 1, wherein a top surface of the case on the second side is about level with a top surface of the sensor device when the sensor device is secured in the second indent.

6. A device comprising:
a case including;
an indent configured to secure an electronic device; and
a voltage detector that is positionable in the indent, wherein the voltage detector has a housing configured to slide in a first direction in the indent and be at least partially prevented from exiting the indent by a securing device, wherein the indent has one or more openings along a length of the indent to accommodate for phone elements to not be obscured.

7. A device comprising:
a case including;
an indent configured to secure an electronic device; and
a voltage detector that is positionable in the indent, wherein the voltage detector has a housing configured to slide in a first direction in the indent and be at least partially prevented from exiting the indent by a securing device, wherein the indent has one or more openings along a length of the indent to accommodate for phone elements to not be obscured, wherein the voltage detector includes a light emitting diode for indication of status of a voltage or a current, wherein the voltage detector has an antenna that is extendable out from the indent with the voltage detector configured to be pointed in a detection direction.

8. The device of claim 7, wherein the antenna is coiled in a two-dimensional plane to act as an inductor caused by the voltage or the current.

\* \* \* \* \*